(12) United States Patent
Nakao et al.

(10) Patent No.: US 9,105,794 B2
(45) Date of Patent: Aug. 11, 2015

(54) OXIDE SUPERCONDUCTOR THIN FILM, SUPERCONDUCTING FAULT CURRENT LIMITER, AND METHOD FOR MANUFACTURING OXIDE SUPERCONDUCTOR THIN FILM

(75) Inventors: Kengo Nakao, Tokyo (JP); Hajime Kasahara, Tokyo (JP); Masakazu Matsui, Tokyo (JP); Norio Matsui, Tokyo (JP); Naoto Edo, Tokyo (JP); Toshiya Kumagai, Ibaraki (JP); Takaaki Manabe, Ibaraki (JP); Mitsugu Sohma, Ibaraki (JP)

(73) Assignees: FURUKAWA ELECTRIC CO., LTD., Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/123,077
(22) PCT Filed: May 30, 2012
(86) PCT No.: PCT/JP2012/063988
§ 371 (c)(1), (2), (4) Date: Nov. 27, 2013
(87) PCT Pub. No.: WO2012/165504
PCT Pub. Date: Dec. 6, 2012

(65) Prior Publication Data
US 2014/0080714 A1 Mar. 20, 2014

(30) Foreign Application Priority Data
May 31, 2011 (JP) .................. 2011-122221

(51) Int. Cl.
*H01L 39/24* (2006.01)
*H01L 39/12* (2006.01)
(Continued)

(52) U.S. Cl.
CPC .............. *H01L 39/128* (2013.01); *C30B 25/02* (2013.01); *C30B 29/225* (2013.01); *H01L 39/16* (2013.01); *H01L 39/2458* (2013.01); *H01L 39/2461* (2013.01); *H01L 39/2425* (2013.01)

(58) Field of Classification Search
USPC .................................. 505/237, 239
See application file for complete search history.

(56) References Cited

U.S. PATENT DOCUMENTS 5,162,294 A * 11/1992 Talvacchio et al. ............ 505/237
5,262,394 A * 11/1993 Wu et al. ........................ 505/237
(Continued)

FOREIGN PATENT DOCUMENTS

| | | |
|---|---|---|
| EP | 2139053 A1 | 12/2009 |
| JP | 05-279192 | 10/1993 |

(Continued)

OTHER PUBLICATIONS

M Sohma, et al. "Structural aspect of high-Jc MOD-YBCO films prepared on large area CeO2-buffered YSZ substrates," Journal of Physics: Conference Series 43 (2006) pp. 349-352.
(Continued)

*Primary Examiner* — Paul Wartalowicz
(74) *Attorney, Agent, or Firm* — Amin, Turocy & Watson, LLP

(57) ABSTRACT

An oxide superconducting thin film includes a substrate having a single crystal structure, the main face of the substrate and a crystal face of the single crystal structure having an angle therebetween; an intermediate layer formed on the main face of the substrate and having an axis oriented in a direction perpendicular to the crystal face; and a superconducting layer formed on the intermediate layer and containing, as a main component, an oxide superconductor having a c-axis oriented in a direction perpendicular to the surface of the intermediate layer. A superconducting fault current limiter and a method of manufacturing an oxide superconducting thin film are also provided.

8 Claims, 6 Drawing Sheets

(51) Int. Cl.
*H01L 39/16* (2006.01)
*C30B 25/02* (2006.01)
*C30B 29/22* (2006.01)

(56) References Cited

U.S. PATENT DOCUMENTS 6,016,433 A * 1/2000 Mizuno et al. ............... 505/190
2008/0026946 A1 1/2008 Yamasaki

FOREIGN PATENT DOCUMENTS

| JP | 07-069788 | 3/1995 |
| JP | 2003-089597 | 3/2003 |
| JP | 2004-303846 | 10/2004 |
| JP | 2005-290528 | 10/2005 |
| JP | 2006-273699 | 10/2006 |
| JP | 2010263036 A | 11/2010 |
| WO | 2007018027 A1 | 2/2007 |

OTHER PUBLICATIONS

International Search Report for PCT Application Serial No. PCT/JP2012/063988 mailed Aug. 28, 2012, 2 pages.
Extended European Search Report for European Patent Application No. 12792513.9 dated Oct. 1, 2014, 10 pages.

* cited by examiner

OXIDE SUPERCONDUCTOR THIN FILM, SUPERCONDUCTING FAULT CURRENT LIMITER, AND METHOD FOR MANUFACTURING OXIDE SUPERCONDUCTOR THIN FILM

CROSS-REFERENCE TO RELATED APPLICATIONS

This application is a U.S. National Stage of PCT Patent Application No. PCT/JP2012/063988, filed May 30, 2012 and entitled "OXIDE SUPERCONDUCTOR THIN FILM, SUPERCONDUCTING FAULT CURRENT LIMITER, AND METHOD FOR MANUFACTURING OXIDE SUPERCONDUCTOR THIN FILM"; which claims priority to Japanese Patent Application No. 2011-122221, filed May 31, 2011. The entireties of the above-referenced applications are incorporated herein by reference.

TECHNICAL FIELD

The present invention relates to an oxide superconducting thin film, a superconducting fault current limiter and a method of manufacturing an oxide superconducting thin film.

BACKGROUND ART

There is a method of obtaining an oxide superconducting thin film by preparing a substrate and depositing an oxide superconductor on a substrate, which is a conventional technique for putting an oxide superconducting material to practical use.

For example, RE-based superconductors (RE: rare earth element), which exhibit a superconducting phenomenon at liquid nitrogen temperature (77 K) or higher, particularly yttrium-based superconductors (hereinafter referred to as "YBCO") represented by a composition formula of $YBa_2Cu_3O_{7-\delta}$, are often used as the oxide superconductor to be deposited.

Oxide superconducting thin films using the RE-based superconductors are expected to be applied to superconducting fault current limiters, cables, and superconducting magnetic energy storages (SMES), and RE-based superconductors and manufacturing methods thereof have drawn a lot of attention.

However, obstacles to practicalization of oxide superconducting materials, including the RE-based superconductors (particularly, oxide superconducting thin films that is formed in the form of a thin film), include difficulty in improving the critical current density characteristics (hereinafter simply referred to as "Jc characteristics").

For example, the practicalization of superconducting fault current limiters using oxide superconducting thin films requires that a largest possible electric current flow with a resistance of zero, which in turn requires that the Jc characteristics of the oxide superconducting thin films be improved.

Patent Document 1 (Japanese Patent Application Laid-Open (JP-A) No. 2005-290528) discloses a method of manufacturing an oxide superconducting thin film, in which a buffer layer (intermediate layer) formed of $CeO_2$ or the like and a superconducting layer formed of an RE-based superconductor or the like are formed on a substrate obtained by cutting a sapphire single crystal at an angle several degrees different from the r-plane or a-plane thereof followed by grounding, whereby the Jc characteristics of the oxide superconducting thin film are improved.

DISCLOSURE OF INVENTION

Technical Problem

Here, crystals of oxide superconductors inherently have electrical anisotropy whereby electricity easily flows in the a-axis direction and b-axis direction of the crystal axes, but does not easily flow in the c-axis direction. Accordingly, in order to deposit an oxide superconductor on a substrate, it is necessary to orient the a-axis or the b-axis to match the direction of electricity flow, and to orient the c-axis in a direction other than the direction of electricity flow.

However, since the superconducting layer is formed on a substrate having an inclined crystal axis in the configuration disclosed in Patent Document 1, the a-axis or b-axis of the RE-based superconductor constituting the superconducting layer deviates from the direction of an electric current, and there is a possibility that an electric current may flow in the c-axis direction.

When an electric current also flows in the c-axis direction as described above, so-called n-value, which is an index of the sharpness of transition from a superconducting state to a resistive state (current and voltage characteristic index: $E \propto J^n$), decreases.

The n-value as well as Jc characteristics are important superconducting characteristics in terms of practical application of the oxide superconducting thin film to superconducting fault current limiters or the like, and a decrease in the n-value would be an obstacle to the practical application.

The present invention has been made in view of these circumstances, and aims to provide an oxide superconducting thin film which has improved Jc characteristics and in which deterioration of n-value characteristics is suppressed, a superconducting fault current limiter, and a method of manufacturing an oxide superconducting thin film.

Solution to Problem

The above-described problem of the present invention is solved by the following means.

<1> An oxide superconducting thin film, including:
a substrate having a single crystal structure, a main face of the substrate and a crystal face of the single crystal structure forming an angle therebetween;
an intermediate layer formed on the main face of the substrate, the intermediate layer having an axis oriented in a direction perpendicular to the crystal face; and
a superconducting layer formed on the intermediate layer, the superconducting layer containing, as a main component, an oxide superconductor having a c-axis oriented in a direction perpendicular to a surface of the intermediate layer.

<2> The oxide superconducting thin film according to <1>, wherein the angle formed between the main face of the substrate and the crystal face of the single crystal structure is from 2° to 15°.

<3> The oxide superconducting thin film according to <1> or <2>, wherein the oxide superconductor is represented by a composition formula $REB_{a2}Cu_3O_{7-\delta}$, wherein RE represents a single rare earth element or plural rare earth elements, and δ represents an oxygen non-stoichiometric amount.

<4> The oxide superconducting thin film according to <3>, wherein the substrate is a sapphire substrate, the crystal face is an r-plane or an a-plane, and the intermediate layer is formed of $CeO_2$ or $REMnO_3$.

<5> The oxide superconducting thin film according to any one of <1> to <4>, wherein the substrate has a rectangular parallelepiped shape, and a side face of the substrate is cut completely through substantially parallel to an intersection line of the crystal face and the main face of the substrate.

<6> A superconducting fault current limiter, including:
a sealed container into which liquid nitrogen is filled;
an electric current in/out unit through which an electric current flows from outside the sealed container to inside the sealed container or from inside the sealed container to outside the sealed container; and
a superconducting fault current limiting element including the superconducting layer of the oxide superconducting thin film of any one of <1> to <5> and electrodes formed on the superconducting layer, the superconducting fault current limiting element being connected to the electric current in/out unit in the sealed container.

<7> A method of manufacturing an oxide superconducting thin film, including:
a process of cutting completely through a substrate having a single crystal structure such that a cut face of the substrate forms an angle with respect to a crystal face of the single crystal structure;
a process of vapor-depositing a thin intermediate layer having a thickness of from 10 nm to 40 nm on the cut face of the substrate, and carrying out annealing at a high temperature of from 700° C. to 950° C.; and
a process of forming a superconducting layer on the intermediate layer with a growth speed in an a-axis direction that is faster than a growth speed in a c-axis direction.

<8> The method of manufacturing an oxide superconducting thin film according to <7>, wherein the process of forming a superconducting layer is performed using an MOD method.

<9> The method of manufacturing an oxide superconducting thin film according to <7> or <8>, wherein, in the process of forming a superconducting layer, the growth speed in the a-axis direction is from 15 times to 25 times the growth speed in the c-axis direction.

Advantageous Effects of Invention

According to the present invention, an oxide superconducting thin film which has improved Jc characteristics and in which deterioration of n-value characteristics is suppressed, a superconducting fault current limiter, and a method of manufacturing an oxide superconducting thin film can be provided.

BEST MODE FOR CARRYING OUT THE INVENTION

Figure 1:
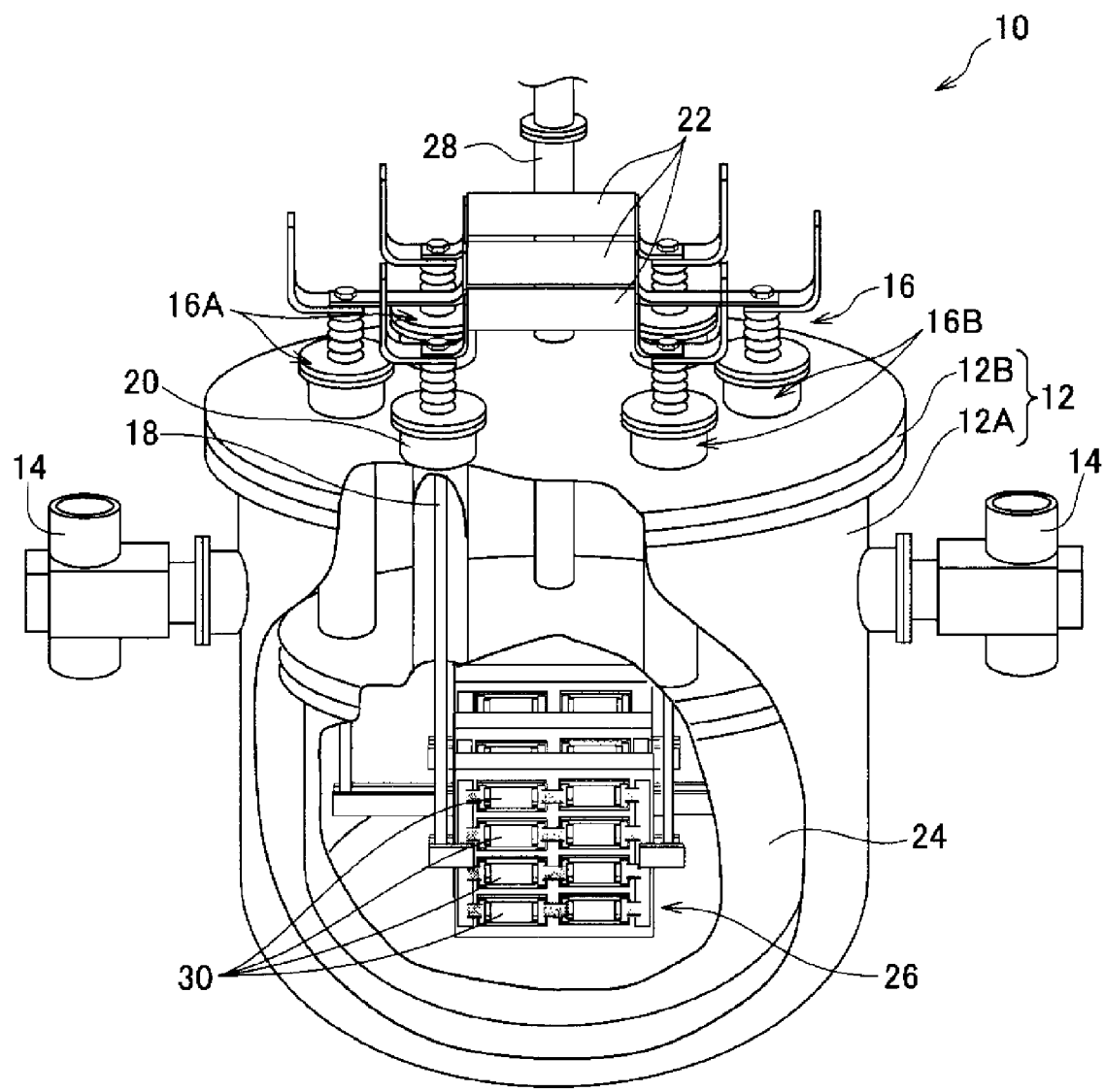
FIG. 1 is a schematic configuration diagram of a superconducting fault current limiter according to an embodiment of the present invention.

Hereinafter, an oxide superconducting thin film, a superconducting fault current limiter, and a method of manufacturing oxide superconducting thin film according to embodiments of the present invention will be described in detail with reference to the attached drawings. In the drawings, members (components) having the same or corresponding functions are designated by the same reference character, and explanation thereof will be omitted, as appropriate.

<Superconducting Fault Current Limiter>

FIG. 1 is a schematic configuration diagram of a superconducting fault current limiter 10 according to an embodiment of the present invention.

The superconducting fault current limiter 10 according to an embodiment of the present invention is a device having a function of suppressing an overcurrent by utilizing S/N transitions (superconducting-normal state transitions) of a superconductor; the device has a resistance of 0 in a normal state but becomes to have a high resistance when an overcurrent higher than a critical current flows.

The superconducting fault current limiter 10 includes a sealed container 12 in which a container body 12A is sealed by being covered with a lid 12B.

To the container body 12A, a refrigerator 14 is connected, and liquid nitrogen is introduced from the refrigerator 14 into the interior of the sealed container 12. To the lid 12B, an electric current in/out unit 16, through which an electric current flows from outside the sealed container 12 to inside the sealed container 12 or from inside the sealed container 12 to outside the sealed container 12, is connected. The electric current in/out unit 16 is configured with a three-phase alternating current circuit, and, specifically, configured to include three electric current inflow ports 16A and three electric current outflow ports 16B corresponding to the three electric current inflow ports 16A.

Each of the electric current inflow ports 16A and the electric current outflow ports 16B is composed of a conducting wire 18 that penetrates through the lid 12B and extends in a direction perpendicular to the lid 12B, and a cylindrical body 20 that covers the conducting wire 18.

One end of the conducting wire 18 of each electric current inflow port 16A that is exposed to the outside is connected to one end of the conducting wire 18 of its corresponding electric current outflow port 16B that is exposed to the outside, via an external resistance 22 as a shunt resistance.

At an end portion of each cylindrical body 20 located inside the container body 12A, an element housing container 24 is supported.

The element housing container 24 is housed in the sealed container 12, and the element housing container 24, including the inside thereof, is cooled by liquid nitrogen filled into the sealed container 12.

A fault current limiting unit 26 composed of plural thin-film superconducting elements 30 is housed in the element housing container 24. In an embodiment of the present invention, specifically, the fault current limiting unit 26 is composed of three sets of thin-film superconducting elements 30, each set being composed of thin-film superconducting elements 30 arranged in four rows and two columns.

The fault current limiting unit 26 is supported by the other ends of the conducting wires 18 of the electric current inflow ports 16A that are located inside, the other ends of the conducting wires 18 of the electric current outflow ports 16B that are located inside, and a support pillar 28. The other ends of the conducting wires 18 of the electric current inflow ports 16A that are located inside and the other ends of the conducting wire 18 of the electric current outflow ports 16B that are located inside are electrically connected via the thin-film superconducting elements 30, to form a three-phase alternating current circuit.

<Outline of Thin-Film Superconducting Element>

Next, an outline of the thin-film superconducting element 30 will be described.

Figure 2:
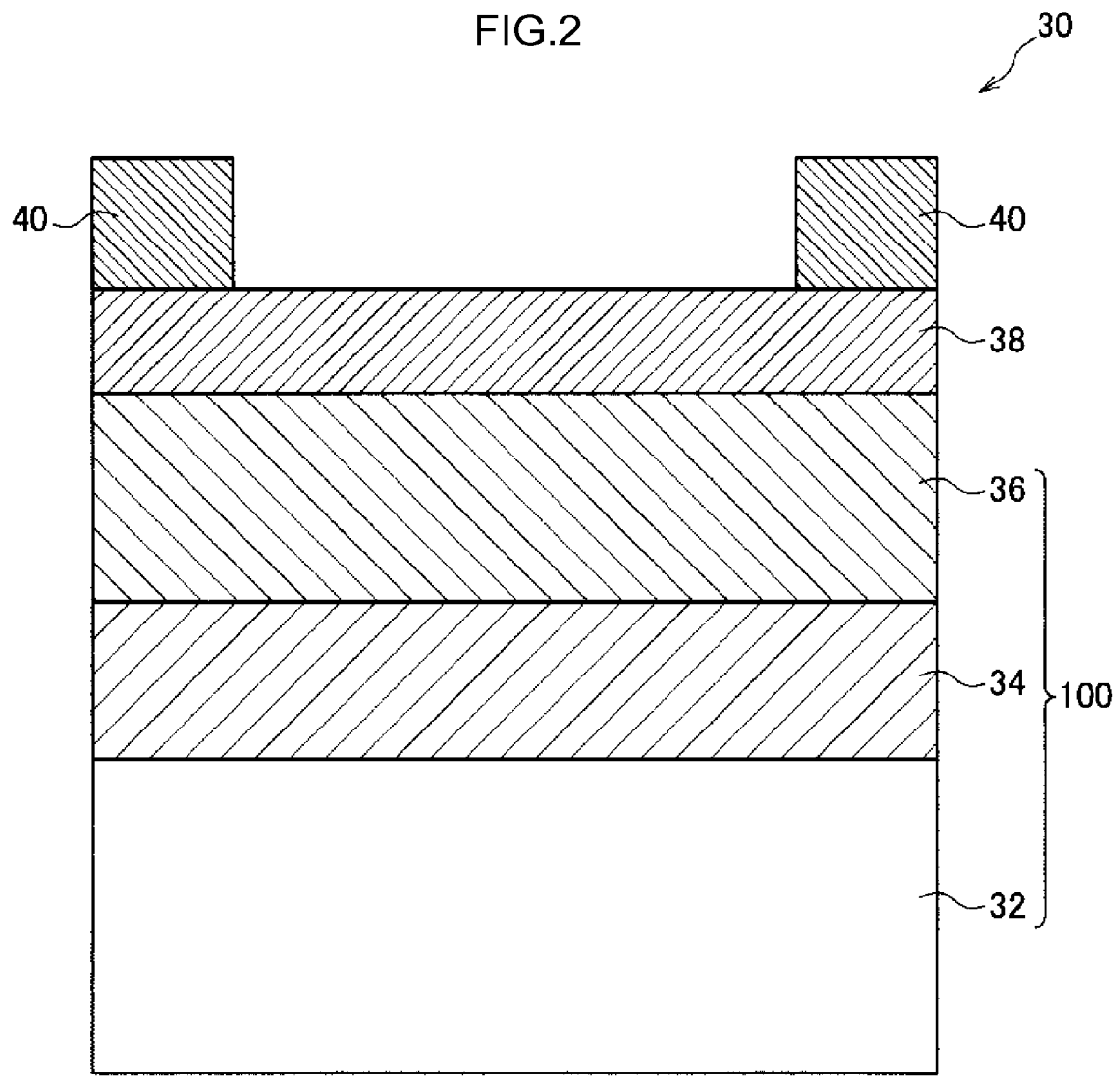
FIG. 2 is a diagram illustrates a cross-section structure of a thin-film superconducting element according to an embodiment of the present invention.

FIG. 2 is a diagram illustrating a cross-sectional structure of the thin-film superconducting element 30 according to an embodiment of the present invention.

As shown in FIG. 2, the thin-film superconducting element 30 has a multilayer structure in which an intermediate layer 34, a superconducting layer 36, and a protective layer 38 are formed in this order on a substrate 32. On the protective layer 38, a pair of electrodes 40 which are electrically connected to the conducting wire 18 are arranged. The substrate 32, the intermediate layer 34, and the superconducting layer 36 in FIG. 2 compose an oxide superconducting thin film 100 according to an embodiment of the present invention.

First, an outline of each element will be described.

The substrate 32 has a single crystal structure of a metal oxide or a ceramic. The shape of the substrate 32 may be any of various shapes that have a main face on which the superconducting layer 36 and intermediate layer 34 can be formed. However, it is preferable to employ a rectangular flat plate shape due to its easiness in handling.

Specific examples of the metal oxide include $Al_2O_3$ (aluminum oxide, particularly sapphire), $(Zr,Y)O_2$ (yttria-stabilized zirconia), $LaAlO_3$ (lanthanum aluminate), $SrTiO_3$ (strontium titanate), $(La_xSr_{1-x})(Al_xTa_{1-x})O_3$ (lanthanum-strontium-tantalum-aluminum oxide), $NdGaO_3$ (neodymium gallate), $YAlO_3$ (yttrium aluminate), $MgO$ (magnesium oxide), $TiO_2$ (titania), and $BaTiO_3$ (barium titanate). Specific examples of the ceramic include silicon carbide and graphite.

Among them, in particular, it is preferable to employ a sapphire substrate, considering that the sapphire substrate does not break even in the case of exposure to a rapid temperature change during use as a fault current limiting element.

The thickness of the substrate 32 is not particularly limited. The thickness of the substrate 32 is, for example, 1 mm.

The intermediate layer 34 is a layer that is formed on the substrate 32 in order to realize high in-plane orientation of the superconducting layer 36, and the intermediate layer 34 may be formed by a single layer film or a multi-layer film.

The intermediate layer 34 may be formed by a material having self-orientating properties, although the intermediate layer 34 is not particularly limited. The material having self-orientating properties may be, for example, a material selected from the group consisting of $CeO_2$ and $REMnO_3$, and is preferably $CeO_2$.

The thickness of the intermediate layer 34 is not particularly limited. The thickness of the intermediate layer 34 is, for example, 20 nm.

The superconducting layer 36 is formed on the intermediate layer 34, and is formed of an oxide superconductor, preferably a copper oxide superconductor.

A crystal material represented by a composition formula of, for example, $REBa_2Cu_3O_{7-\delta}$ (referred to as RE-123), $Bi_2Sr_2CaCu_2O_{8+\delta}$ (including those obtained by doping Pb or the like to Bi sites), $Bi_2Sr_2Ca_2Cu_3O_{10+\delta}$ (including those obtained by doping Pb or the like to Bi sites), $(La,Ba)_2CuO_{4-\delta}$, $(Ca,Sr)CuO_{2-\delta}$ [in which Ca sites may be replaced by Ba], $(Nd,Ce)_2CuO_{4-\delta}$, $(Cu,Mo)Sr_2(Ce,Y)_sCu_2O$ [referred to as (Cu,Mo)-12s2, s representing 1, 2, 3, or 4], $Ba(Pb,Bi)O_3$, or $Tl_2Ba_2Ca_{n-1}Cu_nO_{2n+4}$ (in which n represents an integer of 2 or greater) may be used as the copper oxide superconductor. The copper oxide superconductor may also be formed of any combination of these crystal materials.

RE in $REBa_2Cu_3O_{7-\delta}$ represents a single rare earth element such as Y, Nd, Sm, Eu, Gd, Dy, Ho, Er, Tm, Yb, or Lu, or plural rare earth elements; among these, RE is preferably Y for reasons such as difficulty in substitution between Y sites and Ba sites. In addition, $\delta$ represents an oxygen non-stoichiometric amount, and $\delta$ is, for example, from 0 to 1. A value of $\delta$ nearer to 0 is more preferable since a value of $\delta$ nearer to 0 provides a higher superconducting transition temperature. In a case in which high pressure oxygen annealing or the like is performed using an apparatus such as an autoclave, the oxygen non-stoichiometric amount $\delta$ may be less than 0, i.e., a negative value.

Further, $\delta$ of a crystal material other than $REBa_2Cu_3O_{7-\delta}$ also represents an oxygen non-stoichiometric amount, which is, for example, from 0 to 1.

The thickness of the oxide superconducting layer 36 is not particularly limited. The thickness of the oxide superconducting layer 36 is, for example, 200 nm.

The protective layer 38 is formed of silver or the like. The thickness of the protective layer 38 is not particularly limited. The thickness of the protective layer 38 is, for example, 200 nm. The pair of electrodes 40 are formed of a conductive material such as a gold-silver alloy.

<Details of Thin-Film Superconducting Element>

Next, details of the thin-film superconducting element 30, particularly the crystal structure of each element in the oxide superconducting thin film 100, will be described.

Table 1 shows a relationship between a crystal structure (growth direction) of each element and respective characteristics. In the Table, "A" indicates that the relevant value is high, "C" indicates that the relevant value is low, and "B" indicates that the relevant value is an intermediate value between the grades "A" and "C". In the Table, an "angled-cut" substrate means a substrate that has been cut completely through such that the resultant cut face forms an angle with respect to a crystal face of a single crystal structure constituting the substrate 32, i.e., a substrate that has a single crystal structure having a crystal face forming an angle with respect to the main face of the substrate. In the Table, a substrate "without an angled cut" means a normal substrate that has not been subjected to the cutting.

In the present embodiment, "axial direction growth" in the Table means that the crystal is allowed to grow such that an axis of the crystal is oriented in a direction perpendicular to a crystal face of the single crystal structure constituting the angled-cut substrate 32. Further, "plane direction growth", when used with respect to the intermediate layer, means that the crystal is allowed to grow such that an axis of the crystal is oriented in a direction perpendicular to the cut face (main face) of the single crystal structure constituting the angled-cut substrate 32, and, when used with respect to the superconducting layer, means that the crystal is allowed to grow such that the c-axis of the crystal is oriented in a direction perpendicular to the surface of the intermediate layer.

TABLE 1

| Case | 1 | 2 | 3 | 4 |
|---|---|---|---|---|
| n Value | A | C | A | — |
| Jc | B | A | A | — |
| Superconducting layer | — | Axial direction growth | Plane direction growth | — |
| Intermediate layer | — | Axial direction growth | Axial direction growth | Plane direction growth |
| Substrate | Without an angled cut | Angled-cut | Angled-cut | Angled-cut |

As shown in Table 1, in Case 1 according to a conventional technique, an intermediate layer and an oxide superconducting layer are formed on a substrate without an angled cut. In this case, although the n-value characteristics thereof are sufficiently high for practical use, the Jc characteristics thereof need to be further improved. In the case of the substrate without an angled cut (the angle is approximately zero), it is thought that lattice distortion between the intermediate layer and the superconducting layer is generated due to a difference between the lattice constants of the intermediate layer and the superconducting layer, and that the distortion decreases Jc of the superconducting element.

Further, in Case 4, an intermediate layer that has grown in the plane direction is formed on an angled-cut substrate. In this case, the bonding force inside the intermediate layer is small, and the surface energy thereof is decreased, as a result of which the intermediate layer becomes island-shaped, and the formation of an oxide superconducting layer becomes difficult.

In Cases 2 and 3, use of an angled-cut substrate provides high Jc characteristics (refer to Patent Document 1). It is thought that the Jc characteristics are improved because the angled cut decreases the difference between lattice constants of the intermediate layer and the superconducting layer, thereby decreasing the lattice distortion between the intermediate layer and the superconducting layer.

However, in Case 2, the intermediate layer that has grown in the axial direction is formed on an angled-cut substrate, and the oxide superconducting layer that has grown in the axial direction is formed on the intermediate layer. In this case, when an attempt is made to pass an electric current in the oxide superconducting layer in a direction parallel to the cut face of the substrate, since the c-axis of the oxide superconductor, along which electricity less easily flows, is not perpendicular to the direction of the electric current, the electric current less easily flows in the direction parallel to the cut face of the substrate. It is thought that, due to these reasons, n-value characteristics are deteriorated as compared with Case 1 according to a conventional technique.

Considering these circumstances, in the thin-film superconducting element 30 of Case 3 according to an embodiment of the present invention, the intermediate layer that has grown in the axial direction is formed on the angled-cut substrate, and the oxide superconducting layer that has grown in the plane direction is formed on the intermediate layer. In this case, when an attempt is made to pass an electric current in the oxide superconducting layer in a direction parallel to the cut face of the substrate, the c-axis of the oxide superconductor, along which electricity less easily flows, is perpendicular to the direction of the electric current, and, therefore, the electric current easily flows in the direction parallel to the cut face of the substrate. It is though that, due to these reasons, deterioration of n-value characteristics can be suppressed while improving Jc characteristics.

Figure 3:
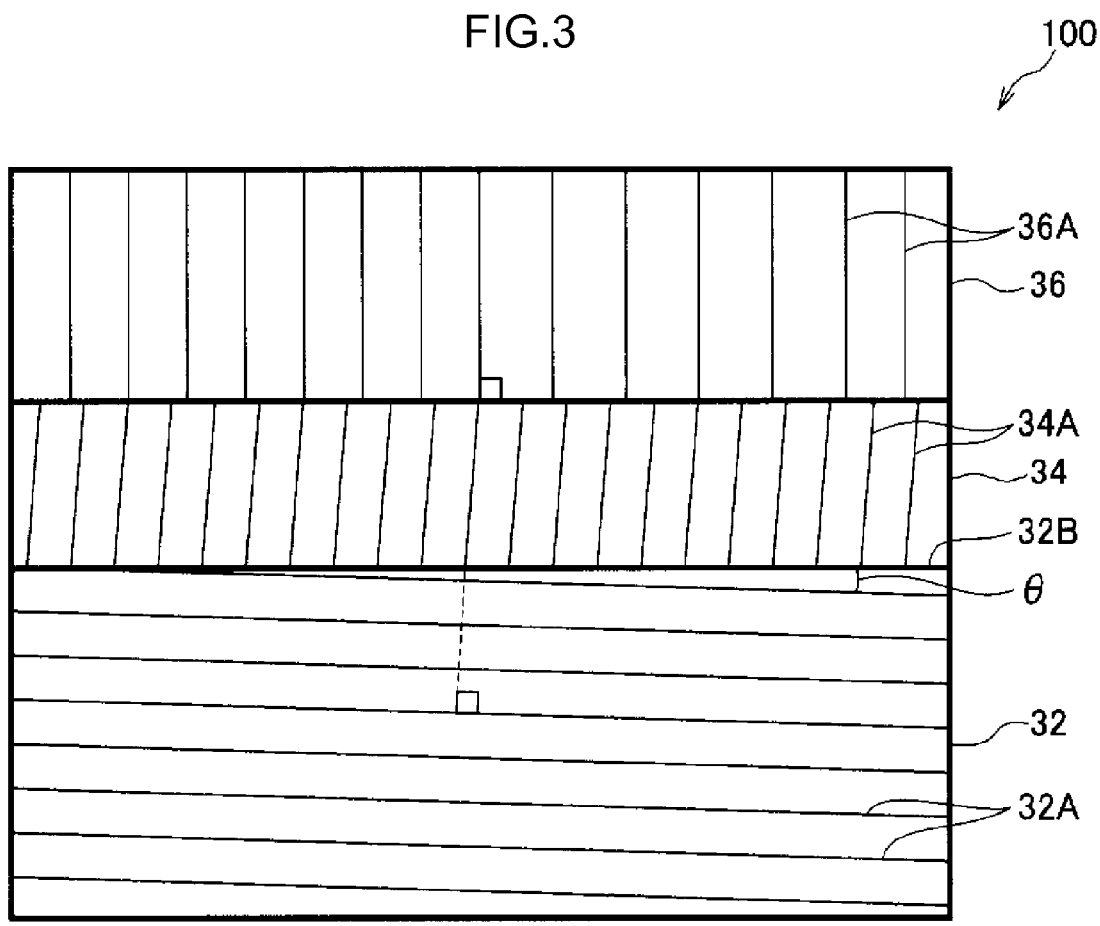
FIG. 3 is a diagram explaining the crystal structures of respective elements of the oxide superconducting thin film illustrated in FIG. 2.
Figure 4:
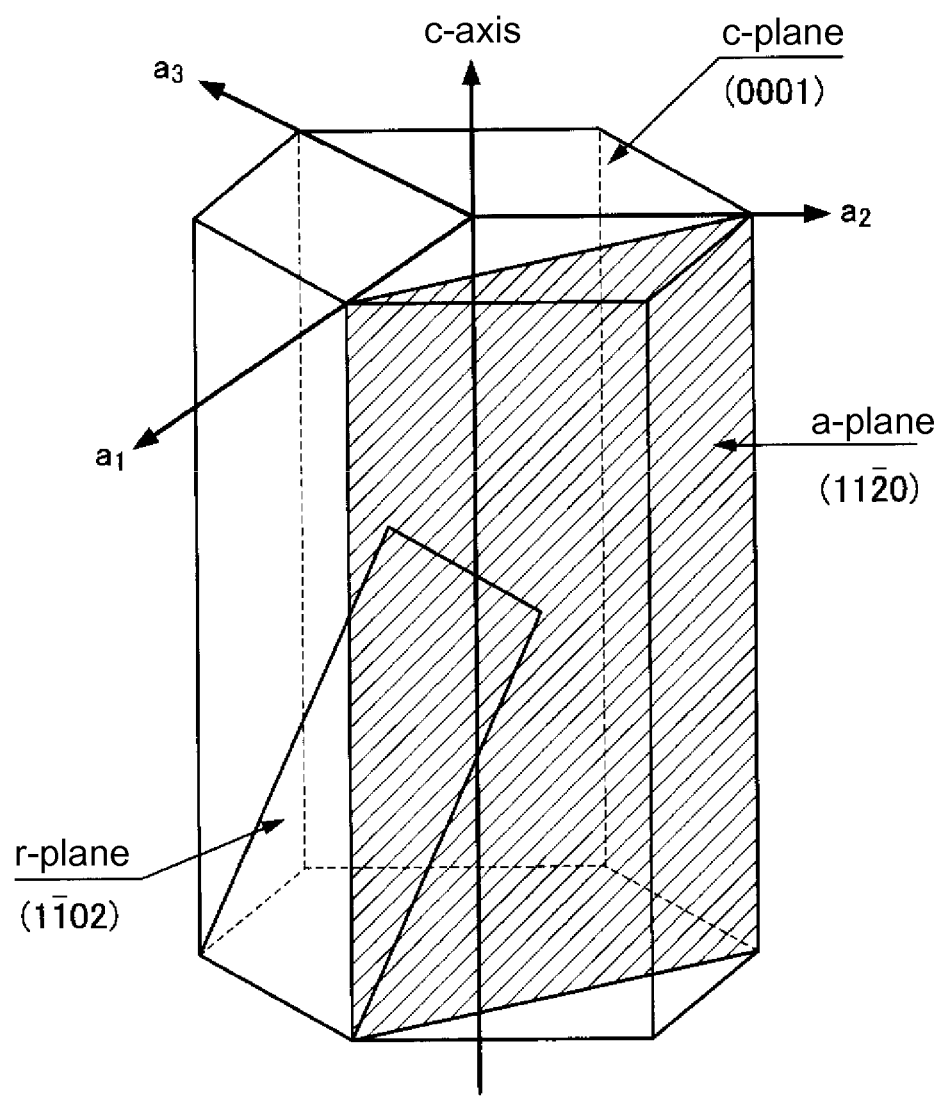
FIG. 4 is a diagram illustrating a sapphire crystal structure.

FIG. 3 is a diagram explaining the crystal structure of each element in the oxide superconducting thin film 100 shown in FIG. 2. FIG. 4 is a diagram showing a crystal structure (unit lattice) of sapphire. In FIG. 4, the a-plane, r-plane, and c-plane represent lattice planes, and numbers noted in parentheses represent the Miller's indices thereof.

The substrate 32 according to the present embodiment is a substrate in which a predetermined crystal face 32A of the single crystal structure forms an angle θ with the main face 32B of the substrate. Specifically, the substrate is formed by cutting completely through a substrate base material at an angle θ with the face of the substrate base material having the predetermined crystal face 32A of the single crystal structure, and grinding the cut face. For example, in a case in which a single crystal sapphire substrate is employed as the substrate 32, and in which YBCO is employed as the material of the superconducting layer 36, it is preferable that the crystal face 32A is the r-plane or the a-plane (refer to FIG. 4), and that the cut face 32B forms an angle of 15 degrees or less with the r-plane or the a-plane. The angle may be set to be 15 degrees or less in order to suppress occurrence of lattice distortion between the intermediate layer and the superconducting layer in a case in which YBCO is allowed to grow in the plane direction. Occurrence of the lattice distortion would make it difficult to form a flat film of the superconducting layer 36 on the intermediate layer 34. The cut face 32B preferably has an angle of 2 degrees or more with the r-plane or the a-plane in order to orient the c-axis of the oxide superconductor to be perpendicular to the direction of the electric current, and in order to allow the electric current to more easily flow in a direction parallel to the cut face of the substrate.

The cut face 32B becomes the main face of the substrate 32, and the intermediate layer 34 is formed on the cut face 32B.

In a case in which the substrate 32 has a rectangular parallelepiped shape (rectangular flat plate shape), side faces of the substrate 32 are preferably cut substantially parallel to an intersection line of the crystal face 32A (actually, a plane obtained by extending the crystal face) and the main face 32B of the substrate. When side faces of the substrate 36 are substantially parallel to the intersection line as described above, side faces of the superconducting layer 36 would also be substantially parallel to the intersection line. With this configuration, when an electric current is allowed to flow from an end portion of the superconducting layer 36 in the longitudinal direction, the direction of the electric current flowing in the superconducting layer 36 would have substantially the same direction as that of the intersection line. As a result of using this substrate 32, the c-axis component of the oxide superconductor present in the direction in which the electric current flows decreases, i.e., the c-axis of the oxide superconductor can be oriented perpendicularly to the direction of the electric current.

Further, the phrase "substantially parallel" refers to a parallel direction, the scope of which includes not only being parallel, but also the case of having an angle within about ±3 degrees from the parallel direction.

The intermediate layer 34 according to the present embodiment is formed on the cut face 32B (the main face of the substrate), and, in the intermediate layer 34, a predetermined axis of the crystal is oriented in a direction perpendicular to the crystal face 32A. For example, when the intermediate layer 34 is formed of $CeO_2$, the a-axis of the crystal of the intermediate layer 34 has grown in the axial direction from the cut face 32B, i.e. in a direction perpendicular to the crystal face 32A. Here, the scope of the term "perpendicular direction" includes not only being perpendicular to the crystal face 32A, but also the case of having an angle within about ±5 degrees from being perpendicular. In addition, when the intermediate layer 34 is formed of a material other than $CeO_2$, the axis oriented in a direction perpendicular to the crystal face 32A is not limited to the a-axis.

The superconducting layer 36 according to the present embodiment is formed on the intermediate layer 34, and contains, as a main component, an oxide superconductor of which the c-axis 36A is oriented in a direction perpendicular to the surface of the intermediate layer 34. For example, in a case in which YBCO is employed as the material of the superconducting layer 36, YBCO is made to grow in the plane direction on the surface of the intermediate layer 34. The scope of the term "perpendicular direction" includes not only being perpendicular to the surface of the intermediate layer 34, but also the case of having an angle of within about ±5 degrees from being perpendicular. In addition, the term "main component" means a component having the largest content among the components contained in the superconducting layer 36, and the content thereof is preferably 90% or more.

Due to possession of the configuration described above, the thin-film superconducting element 30 or the oxide superconducting thin film 100 according to an embodiment of the present invention enables improvement of Jc characteristics as well as suppression of deterioration of n-value characteristics.

<Method of Manufacturing Oxide Superconducting Thin Film>

Next, a method of manufacturing the above-described oxide superconducting thin film 100 will be more specifically described.

FIG. 5 is diagram illustrating processes in the method of manufacturing an oxide superconducting thin film 100 according to an embodiment of the present invention.

—Cutting Process—

Figure 5A:
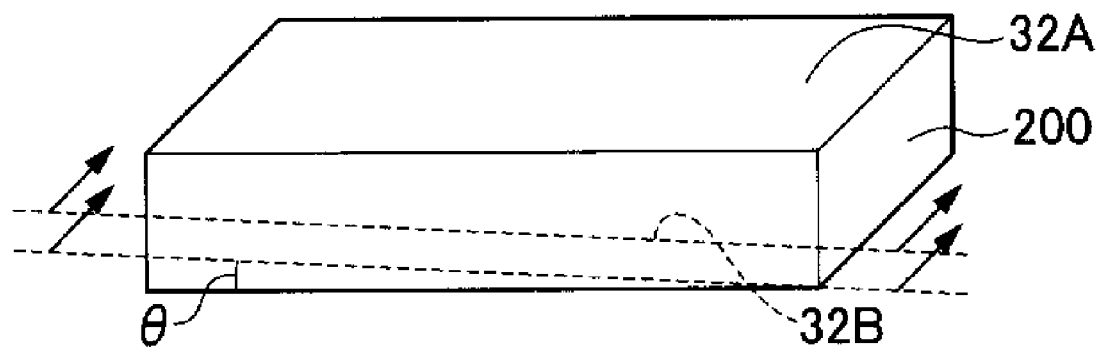
FIG. 5A is a diagram illustrating a process in a method of manufacturing an oxide superconducting thin film according to an embodiment of the present invention.

In the method of manufacturing an oxide superconducting thin film 100 according to an embodiment of the present invention, first, a process of cutting completely through a substrate base material is performed, as shown in FIG. 5A. In the cutting process, a single crystal substrate base material 200, such as a sapphire substrate, that has a predetermined crystal face 32A as a main face is prepared, and the single crystal substrate base material 200 is cut completely through at an angle θ with the predetermined crystal face 32A in an in-plane direction, to obtain a substrate 32 having a rectangular flat plate shape. After the cutting, the cut face 32B of the substrate 32 is ground so as to improve the flatness of the surface.

—Pre-Annealing Process—

Figure 5B:
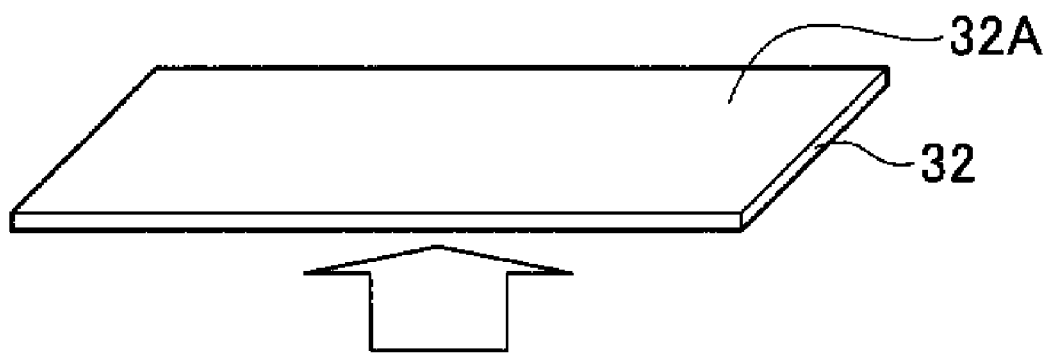
FIG. 5B is a diagram illustrating a process following the process illustrated in FIG. 5A in the method of manufacturing an oxide superconducting thin film.

Next, a pre-annealing process is performed, as shown in FIG. 5B. In the pre-annealing process, the ground substrate 32 is subjected to pre-annealing in a temperature range of, for example, from 1,000° C. to 1,200° C. The pre-annealing process may be omitted, as appropriate.

—Intermediate Layer Forming Process—

Figure 5C:
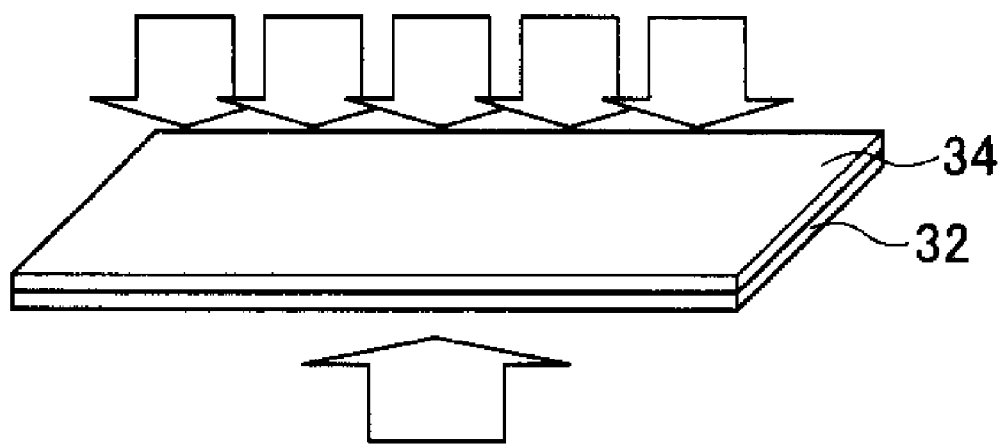
FIG. 5C is a diagram illustrating a process following the process illustrated in FIG. 5B in the method of manufacturing an oxide superconducting thin film.

Next, an intermediate layer forming process is performed, as shown in FIG. 5C. Examples of methods for forming the intermediate layer 34 that may be employed include a pulse laser deposition (PLD) method, a chemical vapor deposition (CVD) method, a metal organic chemical vapor deposition (MOCVD) method, an ion beam assisted deposition (IBAD) method, a trifluoroacetates-metal organic deposition (TFA-MOD) method, a sputtering method, and an electron beam deposition method. An electron beam deposition method is preferably used since this method realizes highly efficient film formation.

In a case in which an electron beam deposition method, for example, is employed in the intermediate layer forming process, deposition is carried out in a state in which a plasma is generated in oxygen at a pressure of from $1 \times 10^{-4}$ Pa to $1 \times 10^{-1}$ Pa and in which the substrate 32 is heated to 700° C. or higher, so as to vapor-deposit a film formed of $CeO_2$ or the like to a thickness of from 10 nm to 40 nm, preferably from about 10 nm to about 20 nm, on the cut face 32B of the substrate 32, thereby forming the intermediate layer 34.

—Post-Annealing Process—

Figure 5D:
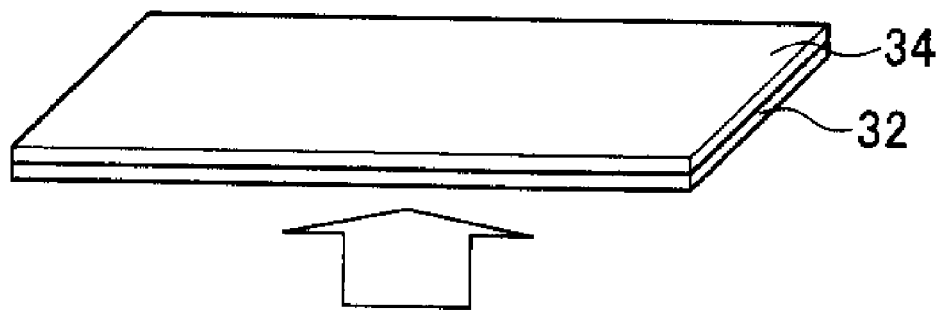
FIG. 5D is a diagram illustrating a process following the process illustrated in FIG. 5C in the method of manufacturing an oxide superconducting thin film.

Next, a post-annealing process is performed, as shown in FIG. 5D. In the post-annealing process, the substrate 32 is heated at a temperature in a temperature range of, for example, from 700° C. to 950° C., preferably in a temperature range of from 800° C. to 900° C., thereby surface-treating the intermediate layer 34. Through this process, the surface flatness of the intermediate layer 34 is improved, and the valence of the material of the intermediate layer 34 is controlled. Further, through this process, the intermediate layer 34 undergoes so-called axial growth on the substrate 32, and the a-axis 34A of $CeO_2$ or the like that constitutes the intermediate layer 34 is oriented in a direction perpendicular to the crystal face 32A of the single crystal structure constituting the substrate 32.

—Superconducting Layer Forming Process—

Figure 5E:
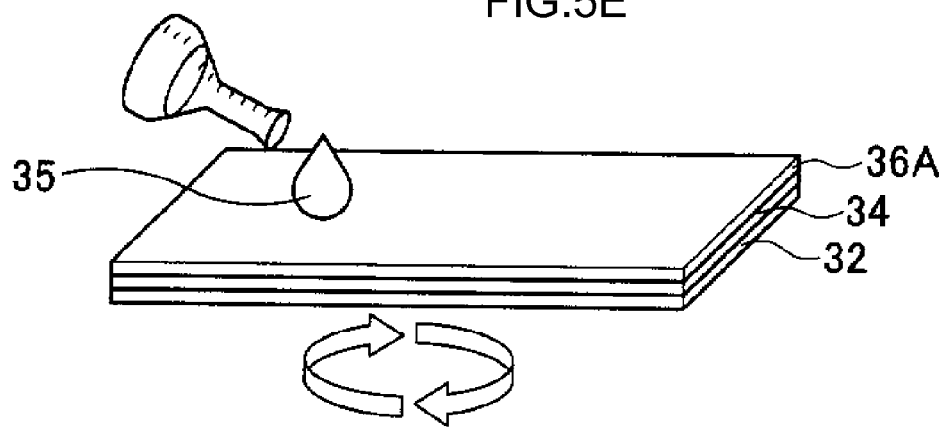
FIG. 5E is a diagram illustrating a process following the process illustrated in FIG. 5D in the method of manufacturing an oxide superconducting thin film.
Figure 5F:
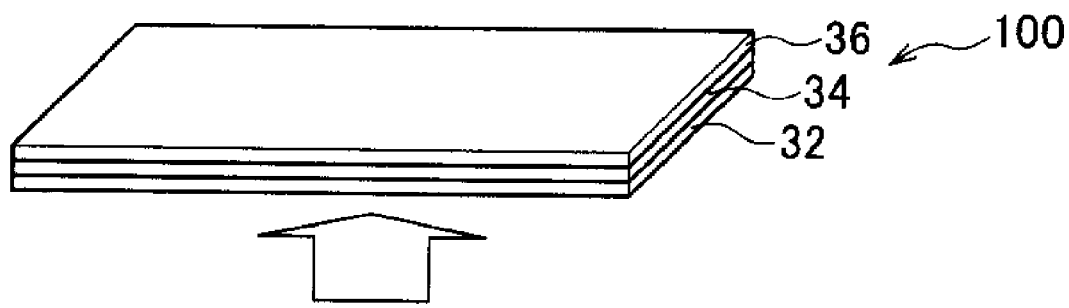
FIG. 5F is a diagram illustrating a process following the process illustrated in FIG. 5E in the method of manufacturing an oxide superconducting thin film.

Next, a superconducting layer forming process is performed, as shown in FIGS. 5E and 5F. Examples of methods for forming (film-forming) the superconducting layer 36 include a PLD method, a CVD method, an MOCVD method, an MOD method, and a sputtering method. An MOD method is preferably used due to its ability to realize highly efficient film formation without using high vacuum.

In a case in which, for example, a superconducting layer 36 formed of YBCO is to be formed using an MOD method in the superconducting layer forming process, first, a solution 35 of organic complexes of yttrium, barium and copper is applied to the surface of the intermediate layer 34 using a spin coater, to form a precursor film 36A, as shown in FIG. 5E. Then, as shown in FIG. 5F, the precursor film 36A is subjected to preliminary calcination, for example, at a temperature of from 300° C. to 600° C. in the air.

After organic solvent is removed by the preliminary calcination, the film 36A is subjected to main calcination at a temperature of from 700° C. to 900° C., whereby a superconducting layer 36 formed of an oxide superconductor of YBCO is obtained from the film 36A.

Here, in the present embodiment, the superconducting layer 36 (film 36A) is formed with a higher growth speed in the a-b plane direction than the growth speed in the c-axis direction. Specifically, the film 36A is subjected to the main calcination in an inert atmosphere. Performing the main calcination in an inert atmosphere accelerates the growth in the a-b plane direction and causes so-called plane-direction growth of the superconducting layer 36, as a result of which the c-axis 36A of YBCO is oriented in a direction perpendicular to the surface of the intermediate layer 34.

In addition, the main calcination may be performed in an inert atmosphere at the beginning, and the atmosphere for the main calcination may be changed to an oxygen atmosphere at some point of time during the main calcination. As a result of this, a superconducting layer 36 having favorable Jc characteristics, which has undergone so-called plane-direction growth and oxygen annealing, can be obtained.

In regard to the growth speed, from the viewpoint of improving Jc characteristics, the growth speed in the a-axis direction (a-b plane direction) is preferably from 10 times to 25 times the growth speed in the c-axis direction, and is more preferably from 15 times to 25 times the growth speed in the c-axis direction.

Modified Embodiments

Although specific embodiments of the present invention are described above in detail, the present invention is not limited to those embodiments. It will be obvious to those skilled in the art that other various embodiments can be practiced within the scope of the invention. For example, two or more of the embodiments described above may be combined, as appropriate, to implement the present invention. In addition, the following modified embodiments may be combined, as appropriate.

In the cutting process shown in FIG. 5A, a case in which the cut face 32B after the cutting is ground is described as an example. However, in a case in which cutting to provide a flat surface can be carried out using a laser cutter or the like, grinding can be omitted, as appropriate.

The protective layer 38 may also be omitted, as appropriate.

Although a case in which the oxide superconducting thin film 100 is used as the thin-film superconducting element 30 of the superconducting fault current limiter 10 has been described in the present embodiment, the oxide superconducting thin film 100 can be applied to various other apparatuses, such as a superconducting wire rod obtained using a substrate having a large length as the substrate 32. The obtained oxide superconducting thin film 100 can be widely applied to apparatuses such as a superconducting magnetic energy storage (SMES), a superconducting transformer, a nuclear magnetic resonance (NMR) analyzer, a single crystal pulling apparatus, a linear motor car and a magnetic separation apparatus.

The disclosure of Japanese Patent Application No. 2011-122221 is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, the oxide superconducting thin film, the superconducting fault current limiter, and the method of manufacturing an oxide superconducting thin film according to the present invention will be described with reference to examples. However, the present invention is by no means limited by these examples.

In Examples, three thin-film superconducting elements for use in the superconducting fault current limiter were manufactured as the oxide superconducting thin films.

Example 1

Specifically, in Example 1, a thin-film superconducting element 1 that includes the oxide superconducting thin film illustrated as Case 3 in the above Table 1 was prepared.

In the preparation of the thin-film superconducting element 1, first, a substrate base material formed of a sapphire single crystal was cut completely through in an in-plane direction at an angle θ of 10° with the r-plane direction of the single crystal, and then the cut face was ground, to prepare a sapphire substrate. Next, the sapphire substrate was subjected to pre-annealing at 1,000° C.

Next, using an electron beam deposition method, vapor deposition was carried out in a state in which a plasma was generated in oxygen at from $1\times10^{-2}$ Pa to $6\times10^{-2}$, and in which the sapphire substrate was heated at 750° C., whereby $CeO_2$ was vapor-deposited on the main face (cut face) of the sapphire substrate to a thickness of about 20 nm, to form an intermediate layer. Next, the substrate was subjected to post-annealing at 800° C., to perform surface treatment of the intermediate layer.

Next, a solution of organic complexes of yttrium, barium, and copper was applied to the surface of the intermediate layer using a spin coater, and preliminary calcination was performed at 500° C. in the air. Then, main calcination was performed at 800° C. in an inert atmosphere, and the atmosphere was changed to an oxygen atmosphere at some point of time during the main calcination. As a result, a superconducting layer formed of YBCO was finally formed on the intermediate layer. In this way, the oxide superconducting thin film illustrated as Case 3 in the above Table 1 was prepared.

On the oxide superconducting thin film obtained, a gold-silver alloy (Au-23 atm % Ag) was deposited by a sputtering method, and electrodes were attached thereto, whereby a thin-film superconducting element 1 was prepared.

Although the obtained thin-film superconducting element 1 is made to get into a superconducting state by being cooled to the liquid nitrogen temperature, the element gets into a normal conducting state when an electric current in a certain quantity or more flows therein, whereby the element is able to limit a fault current.

Comparative Example 1

In Comparative Example 1, a thin-film superconducting element 2 that includes the oxide superconducting thin film illustrated as Case 1 in the above Table 1 was prepared. In Case 1 according to a conventional technique, the intermediate layer and the oxide superconducting layer are formed on the substrate without an angled cut.

In the preparation of the thin-film superconducting element 2, first, a substrate base material that is formed of a sapphire single crystal was cut completely through in an in-plane direction along an r-plane direction of the single crystal (to form a substrate in which an angle between the main face of the substrate and the r-plane direction of the single crystal is 0, that is, a substrate without an angled cut), and then the cut face was ground, where a sapphire substrate was prepared. Next, the sapphire substrate was subjected to pre-annealing at 1,000° C. Next, an intermediate layer and a superconducting layer were prepared in the same manner as that in Example 1. Then, a gold-silver alloy (Au-23 atm % Ag) was deposited on the obtained oxide superconducting thin film using a sputtering method, and electrodes were attached thereto, to prepare a thin-film superconducting element 2.

Comparative Example 2

In Comparative Example 2, a thin-film superconducting element 3 that includes the oxide superconducting thin film illustrated as Case 2 in the above Table 1 was prepared. Here, the angle θ of the cut face was set to 8°. Details of the manufacturing method, except the corresponding columns in Table 1, are the same as those in Example 1.

In the preparation of the thin-film superconducting element 3, first, a substrate base material formed of a sapphire single crystal was cut completely through in an in-plane direction at an angle θ of 8° with an r-plane direction of the single crystal, and then the cut face was ground, whereby a sapphire substrate was prepared. Next, the sapphire substrate was subjected to pre-annealing at 1,000° C. Next, an intermediate layer and a superconducting layer were prepared in the same manner as that in Example 1. Then, a gold-silver alloy (Au-23 atm % Ag) was deposited on the obtained oxide superconducting thin film using a sputtering method, and electrodes were attached thereto, to prepare a thin-film superconducting element 3.

<Evaluation of Crystal>

When pole figures of the sample obtained in Example 1 were measured, it was confirmed that the pole figure of the intermediate layer was inclined in the same direction as the inclination of the sapphire substrate, and that the inclination of the pole figure of YBCO was small. In contrast, when the pole figures of the sample obtained in Comparative Example 2 were measured, it was considered that the pole figure of the intermediate layer was inclined in the same direction as the inclination of the sapphire substrate, and that the pole figure of YBCO was also inclined in the same direction as the inclination of the sapphire substrate.

<Evaluation of n-Value Characteristics>

Electrodes were attached to both ends of each of the thin-film superconducting elements 1 to 3, and the thin-film superconducting elements were left to stand in liquid nitrogen at 1 atmosphere. A voltage value was measured while the electric current was increased at a rate of 1 A/sec, whereby IV characteristics were obtained. The obtained IV characteristics were fitted to the following equation (1), and the n-value was determined.

$$V = Vc(I/Ic)^n \quad \text{Equation (1)}$$

<Evaluation of Jc Characteristics>

Using CRYOSCAN manufactured by THEVA, the critical current density (Jc) distribution of the thin-film superconducting elements 1 to 3 at the liquid nitrogen temperature was measured using an induction method, and the highest Jc in the distribution was evaluated.

The evaluation results are summarized and noted in the Table 2 below.

TABLE 2

| | Example 1 | Comparative Example 1 | Comparative Example 2 |
|---|---|---|---|
| Case | 3 | 1 | 2 |
| n-Value | 10 | 20 | 3 |
| Jc (MA/cm$^2$) | 5 | 3 | 4 |
| Angle of cut face (degrees) | 10 | 0 | 8 |

From the results shown in table 2, it was confirmed that the thin-film superconducting elements 1 and 3 according to Example 1 and Comparative Example 2 exhibited improved Jc characteristics as compared to those of the thin-film superconducting element 2 according to Comparative Example 1, in which the substrate was not cut.

Further, the thin-film superconducting element 1 according to Example 1, in which YBCO forming the superconducting layer grew in the in-plane direction, exhibited lower n-value characteristics than those of the thin-film superconducting element 2 according to Comparative Example 1, in which the substrate was not cut. However, the degree of the decrease in the n-value characteristics of the thin-film superconducting element 1 was smaller than that of the thin-film superconducting element 3 according to Comparative Example 2, in which YBCO forming the superconducting layer grew in the axial direction. Therefore, it was confirmed that the decrease in the n-value characteristics can be suppressed by allowing the superconducting layer to grow in the in-plane direction rather than the axial direction.

Sapphire substrates according to Examples 2 to 10 were prepared by adjusting the angle θ of the cutting of the substrate base material formed of a sapphire single crystal with respect to the r-plane direction of the single crystal as in Table 1, and the sapphire substrates obtained were individually used as the substrate used in the thin-film superconducting element 1. Thin-film superconducting elements were prepared in the same manner as in Example 1, except for these changes.

The critical current density (Jc) and the n-value of each of the obtained superconducting elements were measured.

The following criteria were employed for the evaluation of Jc.

D: less than 3 MA/cm$^3$
B: from 3 MA/cm$^3$ to less than 4 MA/cm$^3$
A: 4 MA/cm$^3$ or more In addition, the following criteria were employed for the evaluation of n-value.

C: less than 10
B: from 10 to less than 20
A: 20 or more

TABLE 3

| | Angle θ (°) | Jc characteristics | n-Value | Evaluation |
|---|---|---|---|---|
| Comparative Example 1 | 0 | D | A | D |
| Example 2 | 1 | B | A | B |
| Example 3 | 2 | A | A | A |
| Example 4 | 3 | A | A | A |
| Example 5 | 5 | A | A | A |
| Example 6 | 8 | A | A | A |
| Example 1 | 10 | A | A | A |
| Example 7 | 13 | A | B | B |
| Example 8 | 15 | A | B | B |
| Example 9 | 17 | A | C | C |
| Example 10 | 20 | A | C | C |

As is understood from Table 3, the thin-film superconducting elements according to Examples 1 to 10 exhibited favorable n-value characteristics as well as favorable Jc characteristics (the overall evaluation was as high as C or higher), as compared with the thin-film superconducting element according to Comparative Example 1.

In addition, when the angle θ of the cutting of the substrate base material formed of a sapphire single crystal with respect to the r-plane direction of the single crystal was 15 degrees or less, evaluation results were as good as B or higher for both of Jc characteristics and n-value characteristics (the overall evaluation was as high as B or higher).

Further, when the angle θ of the cutting of the substrate base material formed of a sapphire single crystal with respect to the r-plane direction of the single crystal was 2 degrees or more, Jc characteristics were A in all cases, and Ic characteristics were favorable as compared with other elements.

Furthermore, when the angle θ of the cutting of the substrate base material formed of a sapphire single crystal with respect to the r-plane direction of the single crystal was from 2 degrees to 10 degrees, Jc characteristics as well as n-value characteristics were A in all cases, and Jc characteristics and n-value characteristics were best in comparison with other elements.

Reference numeral 10 represents a superconducting fault current limiter.
Reference numeral 12 represents a sealed container.
Reference numeral 16 represents an electric current in/out unit.
Reference numeral 24 represents an element housing container.

Reference numeral 30 represents a thin-film superconducting element (superconducting fault current limiting element).
Reference numeral 32 represents a substrate.
Reference numeral 32A represents a crystal face.
Reference numeral 32B represents a cut face and a main face of a substrate.
Reference numeral 34A represents an axis and an a-axis.
Reference numeral 34 represents an intermediate layer.
Reference numeral 36A represents a c-axis.
Reference numeral 36 represents a superconducting layer.
Reference numeral 40 represents electrodes.
Reference numeral 100 represents an oxide superconducting thin film.

The invention claimed is:

1. An oxide superconducting thin film, comprising:
a substrate having a single crystal structure, a main face of the substrate and a crystal face of the single crystal structure forming an angle therebetween, wherein the angle formed between the main face of the substrate and the crystal face of the single crystal structure is from 2° to 15°;
an intermediate layer formed on the main face of the substrate, the intermediate layer having an axis oriented in a direction perpendicular to the crystal face; and
a superconducting layer formed on the intermediate layer, the superconducting layer containing, as a main component, an oxide superconductor having a c-axis oriented in a direction perpendicular to a surface of the intermediate layer.

2. The oxide superconducting thin film according to claim 1, wherein the oxide superconductor is represented by a composition formula $REB_{a2}Cu_3O_{7-\delta}$, wherein RE represents a single rare earth element or a plurality of rare earth elements, and $\delta$ represents an oxygen non-stoichiometric amount.

3. The oxide superconducting thin film according to claim 2, wherein the substrate is a sapphire substrate, the crystal face is an r-plane or an a-plane, and the intermediate layer is formed of $CeO_2$ or $REMnO_3$.

4. The oxide superconducting thin film according to claim 1, wherein the oxide superconductor is represented by a composition formula $REB_{a2}Cu_3O_{7-\delta}$, wherein RE represents a single rare earth element or a plurality of rare earth elements, and $\delta$ represents an oxygen non-stoichiometric amount.

5. The oxide superconducting thin film according to claim 4, wherein the substrate is a sapphire substrate, the crystal face is an r-plane or an a-plane, and the intermediate layer is formed of $CeO_2$ or $REMnO_3$.

6. The oxide superconducting thin film according to claim 1, wherein the substrate has a rectangular parallelepiped shape, and a side face of the substrate is cut completely through substantially parallel to an intersection line of the crystal face and the main face of the substrate.

7. The oxide superconducting thin film according to claim 2, wherein the substrate has a rectangular parallelepiped shape, and a side face of the substrate is cut completely through substantially parallel to an intersection line of the crystal face and the main face of the substrate.

8. A superconducting fault current limiter, comprising:
a sealed container into which liquid nitrogen is filled;
an electric current in/out unit through which an electric current flows from outside the sealed container to inside the sealed container or from inside the sealed container to outside the sealed container; and
a superconducting fault current limiting element comprising the oxide superconducting thin film of claim 1 and electrodes formed on the superconducting layer of the oxide superconducting thin film, the superconducting fault current limiting element being connected to the electric current in/out unit in the sealed container.

* * * * *